United States Patent
Allen et al.

(10) Patent No.: US 9,076,848 B2
(45) Date of Patent: Jul. 7, 2015

(54) SEMICONDUCTOR DEVICE CHANNELS

(71) Applicant: International Business Machines Corporation, Armonk, NY (US)

(72) Inventors: David H. Allen, Rochester, MN (US); Douglas M Dewanz, Rochester, MN (US); David P. Paulsen, Dodge Center, MN (US); John E. Sheets, II, Zumbrota, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,386

(22) Filed: Mar. 12, 2013

(65) Prior Publication Data

US 2014/0264889 A1  Sep. 18, 2014

(51) Int. Cl.
*H01L 23/48* (2006.01)
*H01L 23/52* (2006.01)
*H01L 29/40* (2006.01)
(Continued)

(52) U.S. Cl.
CPC ....... *H01L 21/76877* (2013.01); *H01L 29/4236* (2013.01); *H01L 21/823814* (2013.01); *H01L 29/78* (2013.01); *H01L 29/66545* (2013.01); *H01L 24/64* (2013.01);
(Continued)

(58) Field of Classification Search
CPC .............. H01L 29/66545; H01L 29/78; H01L 29/4236; H01L 27/088; H01L 21/823814
USPC ................... 257/773; 438/638, 672
See application file for complete search history.

(56) References Cited

U.S. PATENT DOCUMENTS

| 5,663,677 A | 9/1997 | Freyman et al. |
| 5,726,499 A | 3/1998 | Irinoda |

(Continued)

FOREIGN PATENT DOCUMENTS

| CN | 101673311 A | 3/2010 |
| CN | 201910624 U | 7/2011 |
| KR | 1020110002749 A | 1/2011 |

OTHER PUBLICATIONS

Allen et al., "Semiconductor Device Channels", filed Mar. 11, 2013.
(Continued)

*Primary Examiner* — Zandra Smith
*Assistant Examiner* — John M Parker
(74) *Attorney, Agent, or Firm* — Peder M. Jacobson; Robert R. Williams

(57) ABSTRACT

A semiconductor device and a method of manufacture are provided. The semiconductor device includes one or more layers having channels adapted to carry signals or deliver power. The semiconductor device may include at least two channels having a substantially equivalent cross-sectional area. Conductors in separate channels may have different cross-sectional areas. A spacer dielectric on a side of a channel may be included. The method of manufacture includes establishing a signal conductor layer including a first channel and a second channel having a substantially equivalent cross-sectional area, introducing a spacer dielectric on a side of the second channel, introducing a first conductor in the first channel having a first cross-sectional area, and introducing a second conductor in the second channel having a second cross-sectional area where the second cross-sectional area is smaller than the first cross-sectional area.

20 Claims, 21 Drawing Sheets

(51) Int. Cl.
*H01L 21/768* (2006.01)
*H01L 23/00* (2006.01)
*H01L 23/522* (2006.01)
*H01L 23/532* (2006.01)
*H01L 29/423* (2006.01)
*H01L 21/8238* (2006.01)
*H01L 29/78* (2006.01)
*H01L 29/66* (2006.01)
*H01L 23/528* (2006.01)

(52) U.S. Cl.
CPC ........ *H01L 23/5222* (2013.01); *H01L 23/5286* (2013.01); *H01L 23/5329* (2013.01); *H01L 23/53295* (2013.01)

(56) References Cited

U.S. PATENT DOCUMENTS

| | | | |
|---|---|---|---|
| 6,091,154 A | 7/2000 | Ohkawa | |
| 6,407,455 B1 | 6/2002 | Wald et al. | |
| 6,498,069 B1* | 12/2002 | Grivna | 438/386 |
| 7,268,434 B2 | 9/2007 | Nakashima | |
| 7,648,900 B2 | 1/2010 | Kirby | |
| 8,404,535 B2* | 3/2013 | Yu et al. | 438/199 |
| 2001/0036734 A1 | 11/2001 | Gris | |
| 2001/0038137 A1 | 11/2001 | Akram | |
| 2001/0054764 A1 | 12/2001 | Nitta et al. | |
| 2001/0055840 A1 | 12/2001 | Verret | |
| 2002/0019100 A1* | 2/2002 | Shukuri et al. | 438/275 |
| 2002/0039836 A1 | 4/2002 | Venkatesan et al. | |
| 2002/0055230 A1 | 5/2002 | Chang | |
| 2002/0076900 A1* | 6/2002 | Park et al. | 438/424 |
| 2002/0185684 A1 | 12/2002 | Campbell et al. | |
| 2003/0022422 A1* | 1/2003 | Torii et al. | 438/183 |
| 2003/0151099 A1* | 8/2003 | Yoshiyama et al. | 257/392 |
| 2003/0183877 A1* | 10/2003 | Yagishita et al. | 257/347 |
| 2006/0012052 A1 | 1/2006 | McDevitt et al. | |
| 2006/0097397 A1 | 5/2006 | Russell | |
| 2006/0189137 A1 | 8/2006 | Anderson et al. | |
| 2007/0222082 A1 | 9/2007 | Sonohara et al. | |
| 2007/0264812 A1 | 11/2007 | Lung | |
| 2007/0273044 A1 | 11/2007 | Yang et al. | |
| 2008/0029834 A1* | 2/2008 | Sell | 257/411 |
| 2008/0283960 A1 | 11/2008 | Lerner | |
| 2010/0301486 A1 | 12/2010 | Frohberg et al. | |
| 2011/0001168 A1 | 1/2011 | Ko et al. | |
| 2011/0014786 A1 | 1/2011 | Sezginer et al. | |
| 2011/0070739 A1 | 3/2011 | Cheng et al. | |
| 2011/0115047 A1 | 5/2011 | Hebert et al. | |
| 2011/0147936 A1 | 6/2011 | Chu et al. | |
| 2011/0217838 A1 | 9/2011 | Hsieh et al. | |
| 2011/0227232 A1 | 9/2011 | Bonilla et al. | |
| 2011/0281410 A1* | 11/2011 | Liu et al. | 438/230 |
| 2011/0291292 A1 | 12/2011 | Frohberg et al. | |
| 2012/0110521 A1 | 5/2012 | Agarwal et al. | |
| 2012/0161889 A1 | 6/2012 | Ozawa et al. | |
| 2012/0299188 A1 | 11/2012 | Chen et al. | |
| 2013/0003108 A1 | 1/2013 | Agarwal et al. | |
| 2013/0007674 A1 | 1/2013 | Abou Ghaida et al. | |
| 2013/0043556 A1 | 2/2013 | Horak et al. | |
| 2013/0061183 A1 | 3/2013 | Abou Ghaida et al. | |
| 2013/0061185 A1 | 3/2013 | Abou Ghaida et al. | |
| 2013/0334610 A1 | 12/2013 | Moroz et al. | |

OTHER PUBLICATIONS

Allen et al., "Multiple-Patterned Semiconductor Device Channels", filed Mar. 11, 2013.

Sapatnekar, S., et al. "Analysis and Optimization of Power Grids", IEEE, Design & Test of Computers. Published May-Jun. 2003, vol. 20 Issue 3, pp. 7-15, © 2003 IEEE.

Mirsaeedi, M., et al., "A statistical yield optimization framework for interconnect in double patterning lithography", Nov. 2011. Microelectronics Journal, vol. 42, Issue 11, pp. 1231-1238.

Mirsaeedi, M., et al., "Overlay-aware interconnect yield modeling in double patterning lithography", Jun. 2-4, 2010, IEEE International Conference on IC Design and Technology (ICICDT), pp. 138-141.

Yang, J. et al., "Overlay aware interconnect and timing variation modeling for Double Patterning Technology", Nov. 10-13, 2008, IEEE/ACM International Conference on Computer-Aided Design, ICCAD 2008, pp. 488-493.

Chen, E., "III. Wet and Dry Etching", Apr. 12, 2004. Applied Physics 298r. pp. 1-18.

* cited by examiner

200

Establishing a signal conductor layer having a first channel and a second channel, the first channel and the second channel having a same cross-sectional area

210

↓

Introducing a spacer dielectric on a side of the second channel

220

↓

Introducing a first conductor in the first channel having a first cross-sectional area

230

↓

Introducing a second conductor in the second channel having a second cross-sectional area, the second cross sectional area smaller than the first cross sectional area

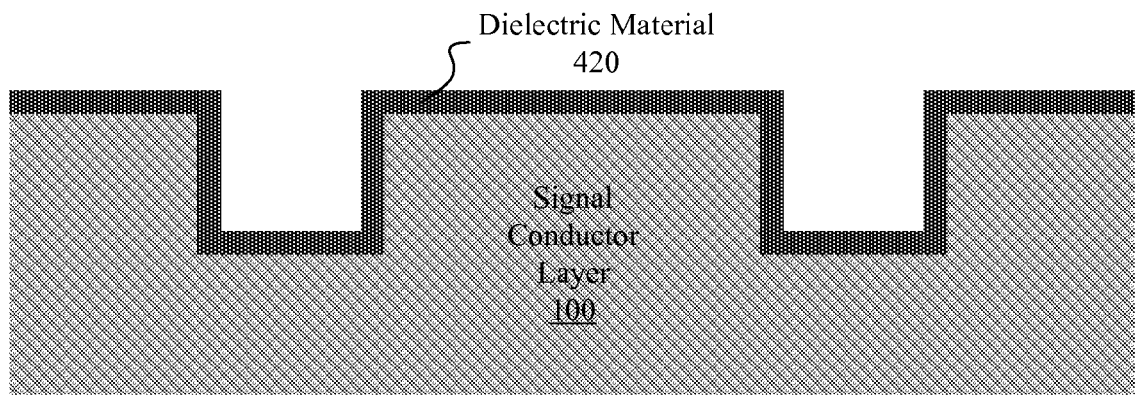
Apply a photoresist material
403
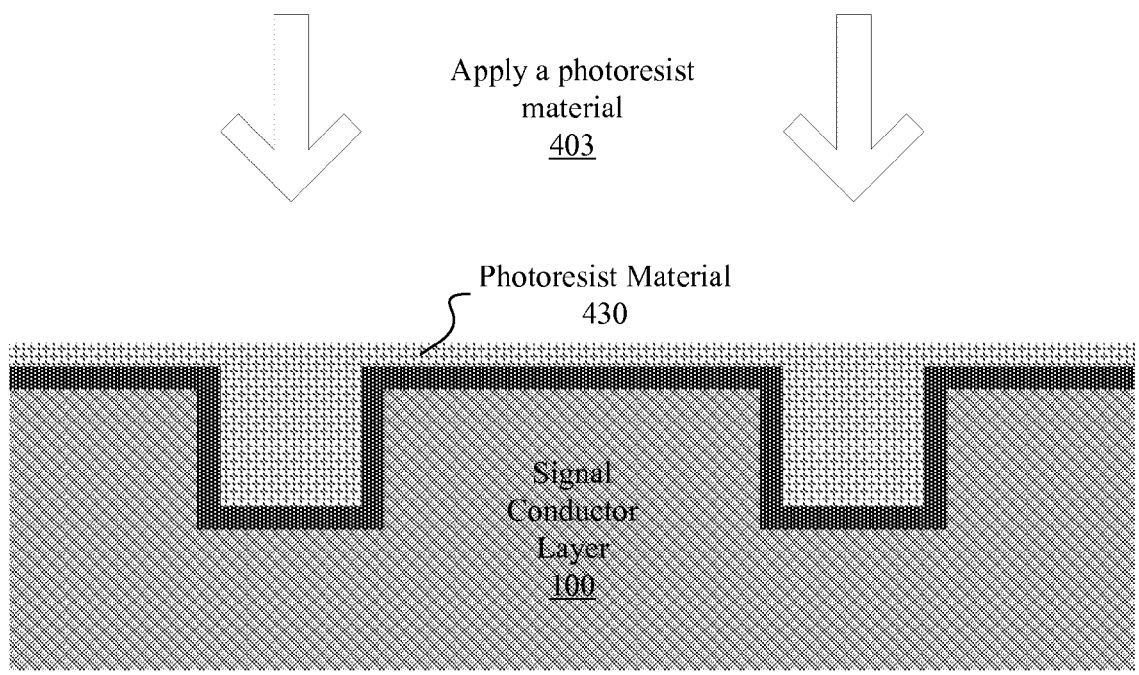
FIG. 4D

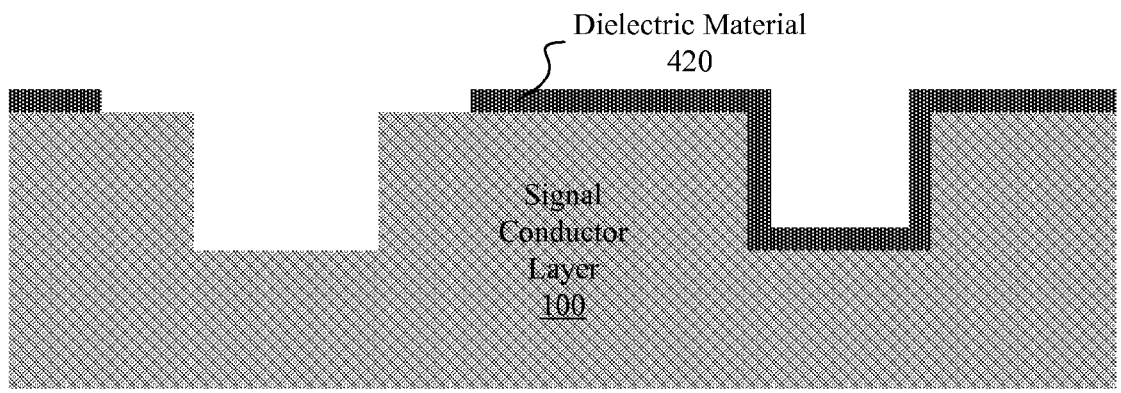
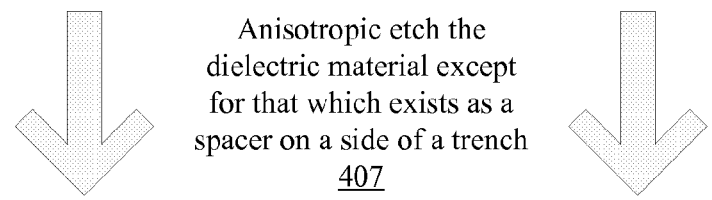
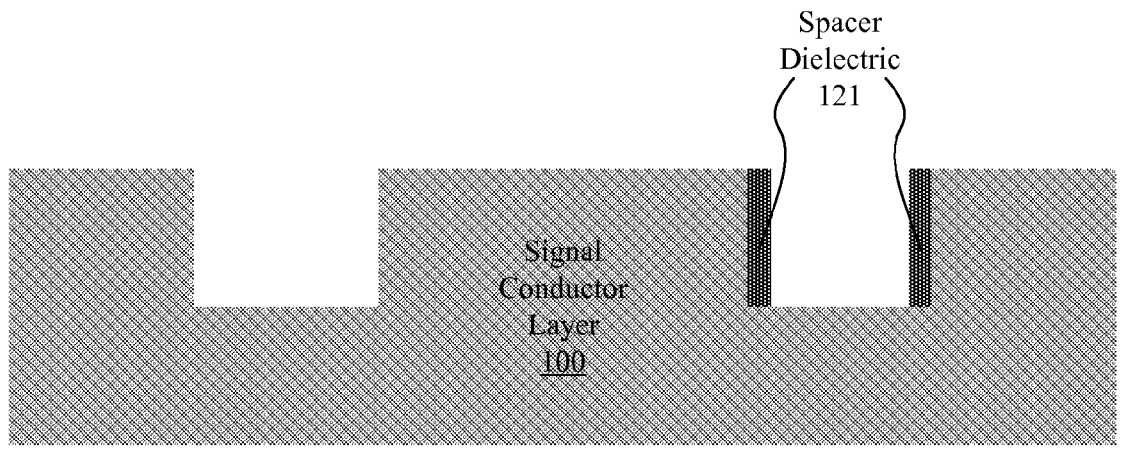
FIG. 4H

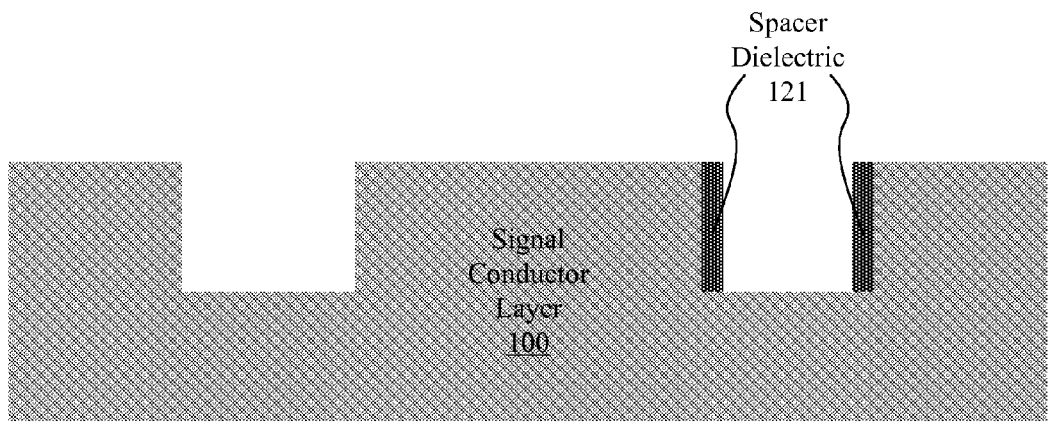
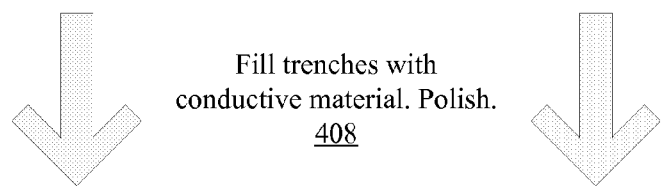
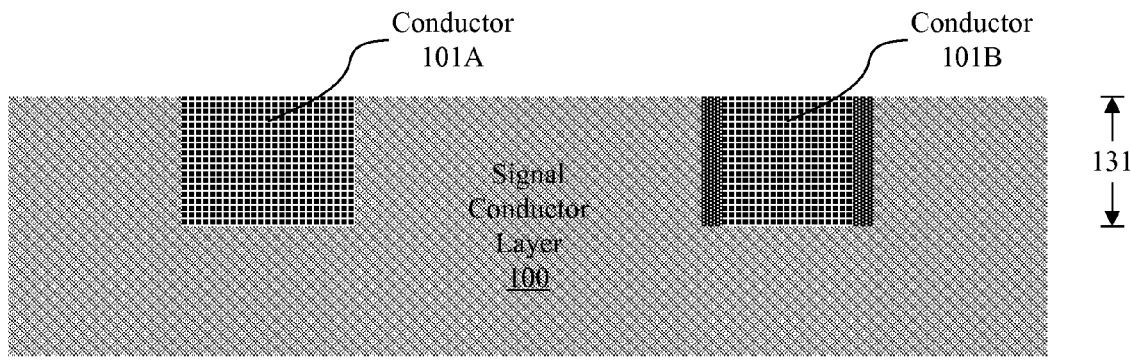
FIG. 4I

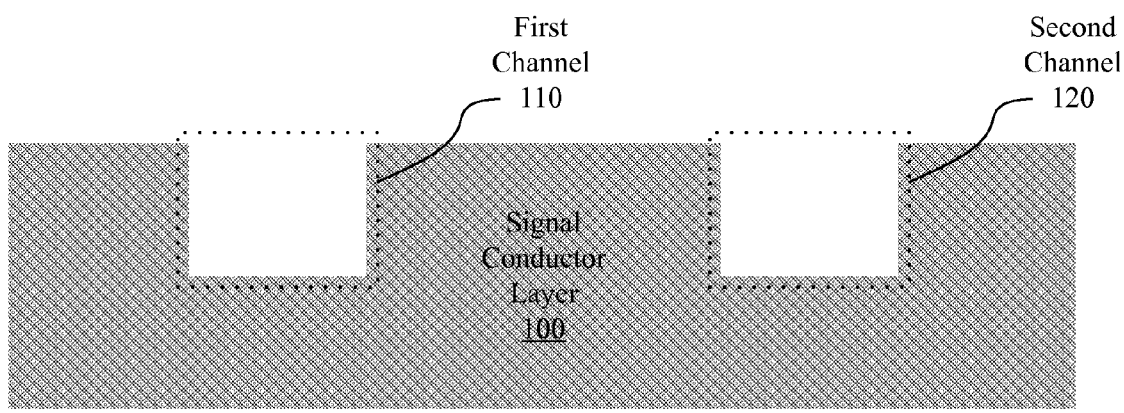
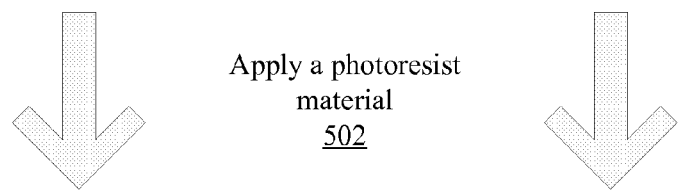
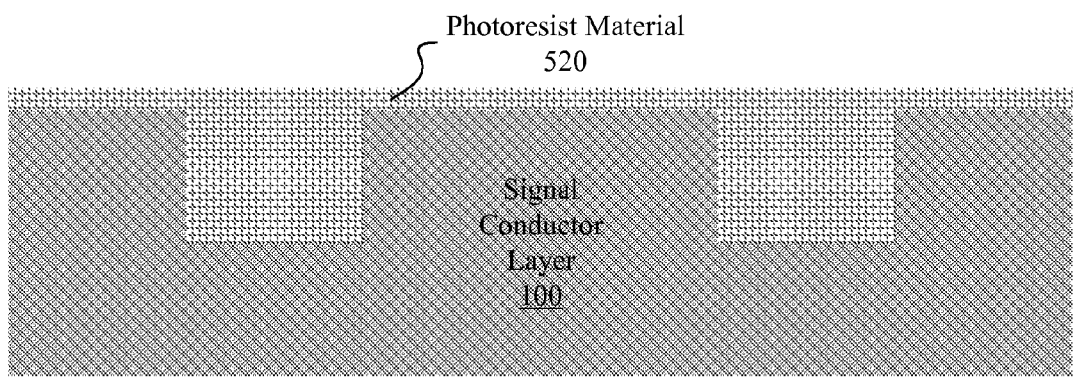
FIG. 5C

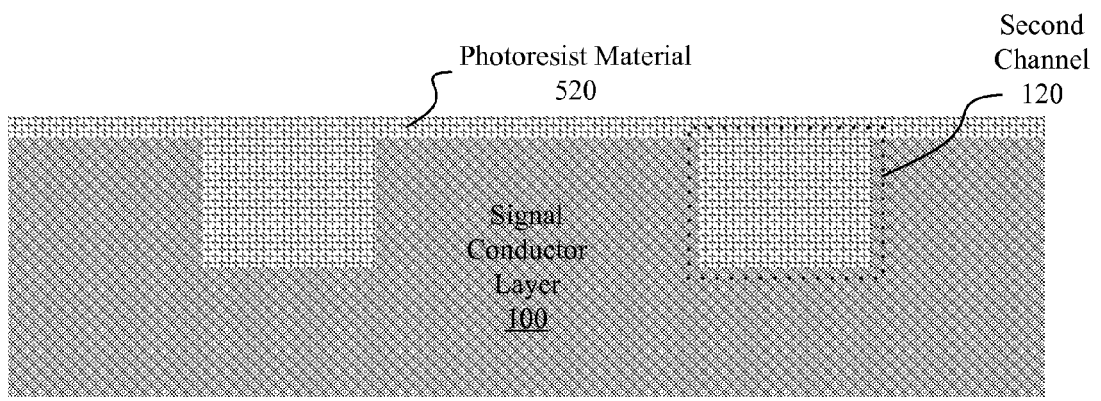
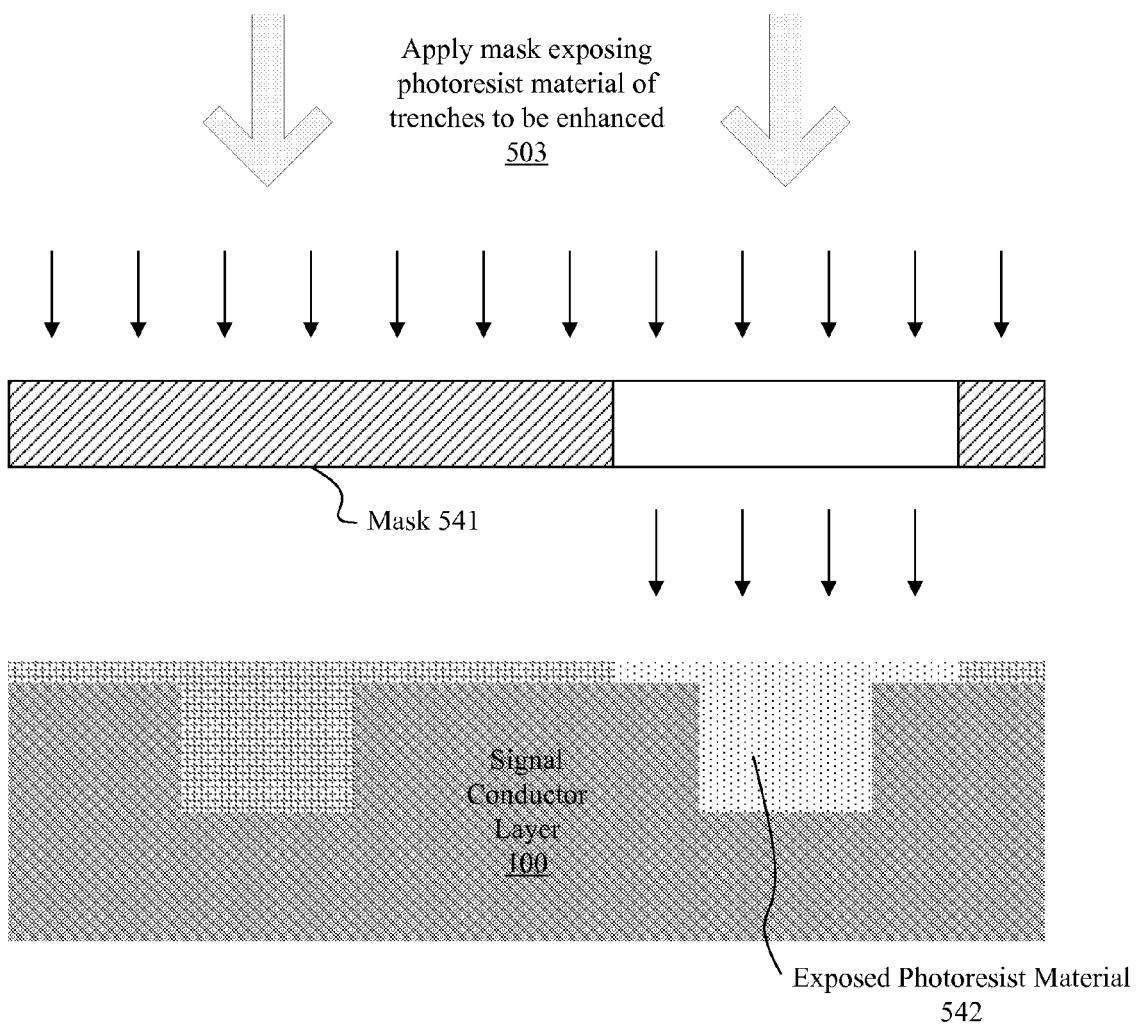
FIG. 5D

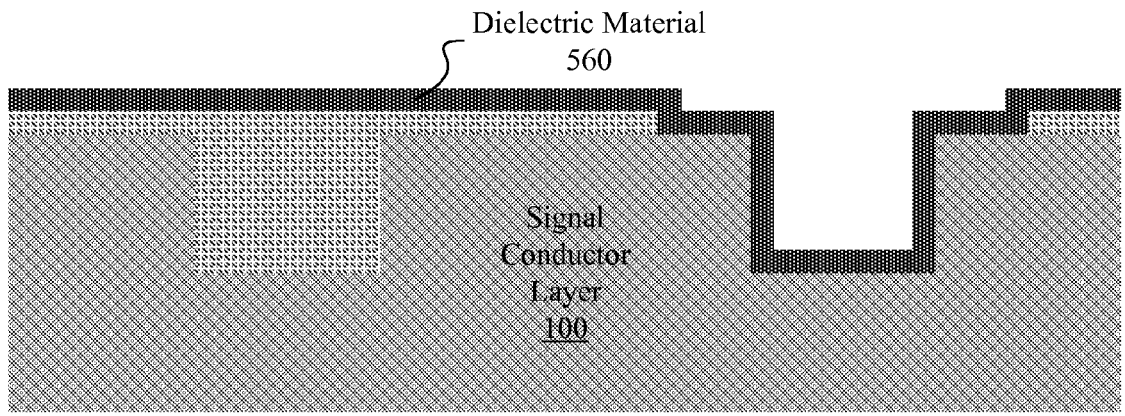
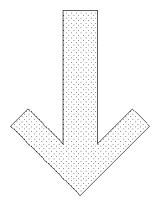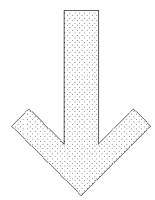
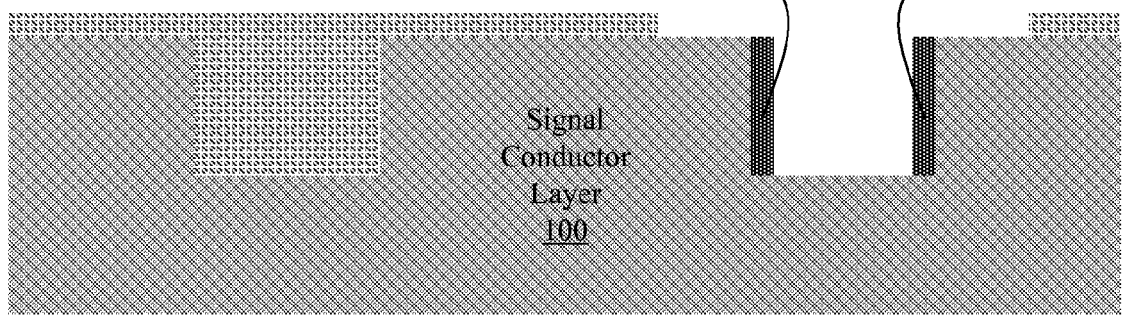
FIG. 5G

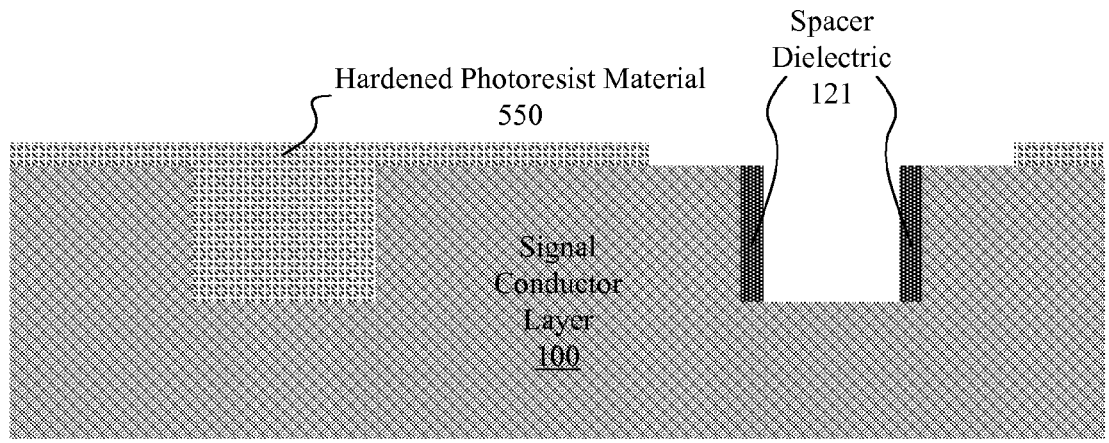
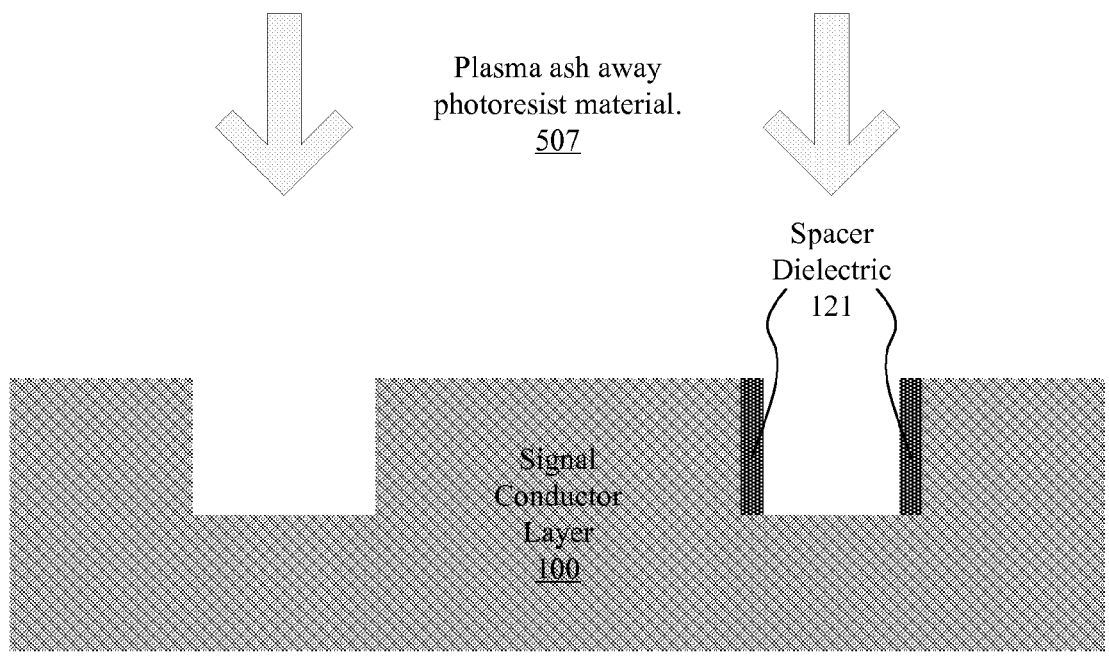
FIG. 5H

SEMICONDUCTOR DEVICE CHANNELS

TECHNICAL FIELD

This disclosure relates generally to a semiconductor device and, more particularly, relates to signal integrity and power delivery of a semiconductor device.

BACKGROUND

The semiconductor industry is producing more and more capable components with smaller and smaller feature sizes. The production of such semiconductor devices reveals new design and manufacturing challenges to be addressed in order to maintain or improve semiconductor device performance. Simultaneously having semiconductor wiring stacks with high density, high yield, good signal integrity as well as suitable power delivery may present challenges.

SUMMARY

In an embodiment, this disclosure relates to a semiconductor device. The semiconductor device may include one or more layers. The semiconductor device may include channels adapted to carry signals or deliver power. The semiconductor device may include a first channel and a second channel having a substantially equivalent cross-sectional area. The first channel may be a power channel and the second channel may be a signal channel. A first conductor in the first channel may have a first cross-sectional area. A second conductor in the second channel may have a second cross-sectional area. The second cross-sectional area may be smaller than the first cross-sectional area. A spacer dielectric may be introduced on a side of the second channel.

In an embodiment, this disclosure relates to a method of manufacture of a semiconductor device. The method may include establishing a signal conductor layer including a first channel and a second channel having a substantially equivalent cross-sectional area. The method may include introducing a spacer dielectric on a side of the second channel. The method may include introducing a first conductor in the first channel having a first cross-sectional area. The method may include introducing a second conductor in the second channel having a second cross-sectional area. The second cross-sectional area may be smaller than the first cross-sectional area.

BRIEF DESCRIPTION OF THE DRAWINGS

FIG. 2 is a flow chart showing an operation to manufacture a semiconductor device according to an embodiment;

FIG. 4D illustrates an applying of a photoresist material to the semiconductor device according to an embodiment;

FIG. 4H illustrates an anisotropic etch of the dielectric material according to an embodiment;

FIG. 4I illustrates a conductor filling the trenches according to an embodiment;

FIG. 5C illustrates an applying of a photoresist material to the semiconductor device according to an embodiment;

FIG. 5D illustrates an exposing of the photoresist material according to an embodiment;

FIG. 5G illustrates an anisotropic etch of the dielectric material according to an embodiment;

FIG. 5H illustrates a removal of the hardened photoresist material according to an embodiment.

DETAILED DESCRIPTION

A wiring track on a given plane of a semiconductor device may be designed to lithography and dielectric breakdown specifications. Having signal traces and power traces on a given plane may present challenges due to sometimes favoring low capacitance on signal wires and high capacitance on power wires. Designing may allow for low capacitance on signal wiring tracks and high capacitance on power wiring tracks. Aspects of the disclosure may allow design of unique routing wires on a plane of wires of a semiconductor device. Aspects of the disclosure may reduce lateral capacitance and signal coupling on a wiring track adapted to carry a signal.

Aspects of the disclosure may include a signal conductor layer. The signal conductor layer may be a metal layer. The signal conductor layer may include channels which may be established. The channels may be trenches. The channels may include a power channel and a signal channel. A channel such as the signal channel may include a dielectric material which may be introduced. The dielectric material of the channel such as the signal channel may be a spacer. Where the dielectric material is not part of one of the channels, the channel may include a conductor which may be introduced. Aspects may include a cross-sectional area of the channels. Aspects may also include a cross-sectional area for each conductor.

Figure 1:
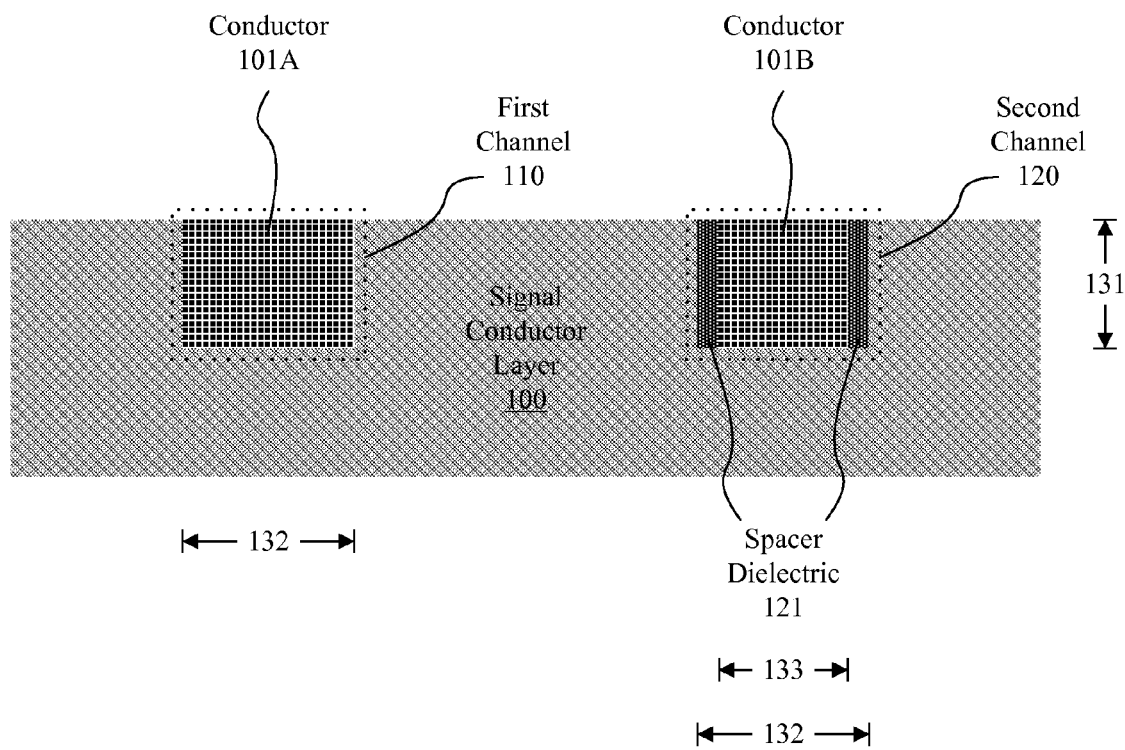
FIG. 1 illustrates a cross-sectional view of a semiconductor device according to an embodiment.

FIG. 1 illustrates a cross-sectional view of a semiconductor device according to an embodiment. The semiconductor device may include a signal conductor layer 100. The signal conductor layer may be a metal layer. The signal conductor layer may include a dielectric material. The signal conductor layer may include an oxide. Particular dielectric materials such as silicon dioxide may be used, though others are considered.

The signal conductor layer 100 may include a channel. A channel may be a trench. The channel may be adapted to hold a wiring track or wire which may be adapted to carry a signal or deliver power. In particular, the signal conductor layer 100 may include a first channel 110. The first channel 110 may be a trench. The first channel 110 may be a power channel. The first channel 110 may have a cross-sectional height 131 and a cross-sectional width 132. A cross-sectional area of the first channel 110 may be the product of the cross-sectional height 131 and the cross-sectional width 132. The first channel 110 may include a conductor 101A which may be adapted to deliver power. A first cross-sectional area of the conductor 101A in the first channel 110 may be the product of the cross-sectional height 131 and the cross-sectional width 132.

Also, the signal conductor layer 100 may include a second channel 120. The second channel 120 may be a trench. The second channel 120 may be a signal channel. The second channel 120 may have the cross-sectional height 131 and the cross-sectional width 132. A cross-sectional area of the second channel 120 may be the product of the cross-sectional height 131 and the cross-sectional width 132. The cross-sectional area of the first channel 110 may be substantially equivalent to the cross-sectional area of the second channel 120. A substantially equivalent area may be an area of a first particular cross-section within ten percent of an area of a second particular cross-section. The second channel 120 may include a conductor 101B which may be adapted to carry a signal. A second cross-sectional area of the conductor 101B in the second channel 120 may be the product of the cross-sectional height 131 and a cross-sectional width 133. The second cross-sectional area of the conductor 101B in the second channel 120 may be smaller than the first cross-sectional area of the conductor 101A in the first channel 110. Aspects described may reduce lateral capacitance and signal coupling.

In embodiments, the second channel 120 may include a spacer dielectric 121. Presence of the spacer dielectric 121 may reduce lateral capacitance and signal coupling. The spacer dielectric 121 may be located on at least one vertical side of the second channel 120. In embodiments, the spacer dielectric 121 may be on a bottom side or surface of the second channel 120. The spacer dielectric 121 may have a permittivity. The permittivity may be a relative permittivity and may be denoted as $\in_r(\omega)$ (sometimes κ or K) and may be defined as $$\varepsilon_r(\omega) = \frac{\varepsilon(\omega)}{\varepsilon_0},$$

where $\in(\omega)$ is a complex frequency-dependent absolute permittivity of the material, and $\in_0$ is a vacuum permittivity. The permittivity of the spacer dielectric 121 may be less than the permittivity of silicon dioxide which may be 3.9. In embodiments, the spacer dielectric 121 may have a permittivity of 2.3 or a similar permittivity of less than 3.0. In embodiments, the spacer dielectric 121 may exist such that the second cross-sectional area of the conductor 101B in the second channel 120 may be between eighty percent and one-hundred percent of the first cross-sectional area of the conductor 101A in the first channel 110. In embodiments, the spacer dielectric 121 may take up between zero and twenty percent of the cross-sectional area of the first channel. Capacitive coupling may be influenced by altering a size, such as a width, of the spacer dielectric 121. In embodiments, the spacer dielectric 121 may not be an equivalent dielectric material to that of the signal conductor layer 100. Other possibilities regarding the spacer dielectric 121 are considered, including using flourine-doped silicon dioxide, using carbon-doped silicon dioxide, or varying the cross-sectional areas involved.

FIG. 2 is a flow chart showing an operation 200 to manufacture a semiconductor device according to an embodiment. At block 210, operation 200 may include establishing a signal conductor layer having a first channel and a second channel with the first channel and the second channel having a substantially equivalent cross-sectional area. A substantially equivalent area may be an area of a first particular cross-section within ten percent of an area of a second particular cross-section. At block 220, operation 200 may include introducing a spacer dielectric on a side of the second channel. At block 230, operation 200 may include introducing a first conductor in the first channel having a first cross-sectional area. At block 240, operation 200 may include introducing a second conductor in the second channel having a second cross-sectional area, the second cross sectional area smaller than the first cross sectional area. Aspects described may reduce lateral capacitance and signal coupling. In addition to the described, other embodiments having fewer steps, more steps, or different steps are contemplated. Also, some embodiments may perform some or all of the steps in FIG. 2 in a different order.

Figure 3:
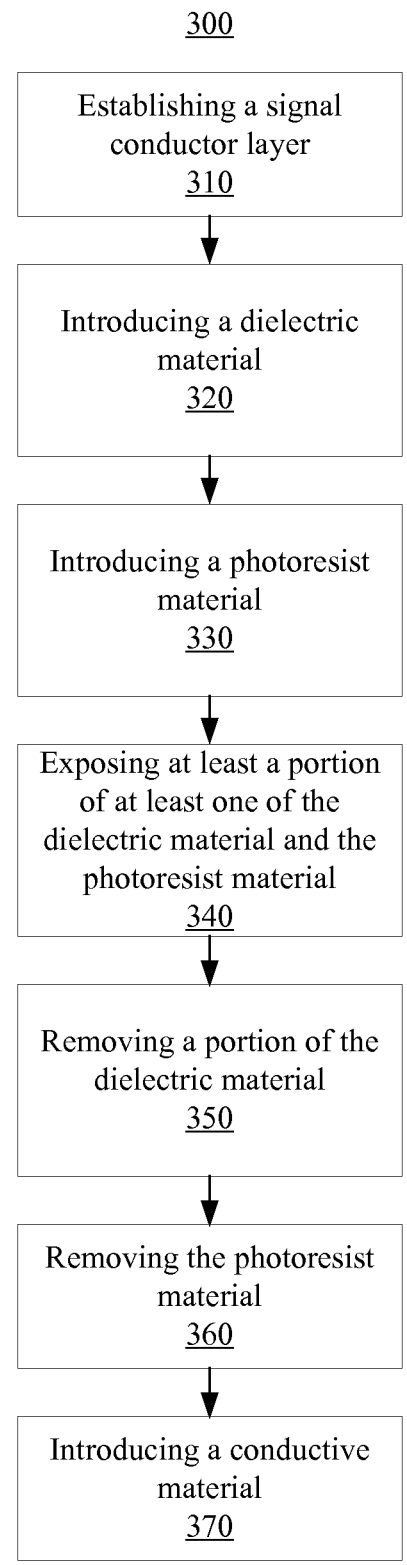
FIG. 3 is a flow chart showing an operation to manufacture a semiconductor device according to an embodiment.

FIG. 3 is a flow chart showing an operation 300 to manufacture a semiconductor device according to an embodiment. At block 310, operation 300 may include establishing a signal conductor layer. At block 320, operation 300 may include introducing a dielectric material. At block 330, operation 300 may include introducing a photoresist material. At block 340, operation 300 may include exposing at least a portion of at least one of the dielectric material and the photoresist material. At block 350, operation 300 may include removing a portion of the dielectric material. Presence of the dielectric material remaining may reduce lateral capacitance and signal coupling. Capacitive coupling may be influenced by altering a size, such as a width, of the dielectric material remaining. At block 360, operation 300 may include removing the photoresist material. At block 370, operation 300 may include introducing a conductive material. Operation 400 of FIG. 4A and operation 500 FIG. 5A may describe operation 300 with further details. In addition to the described, other embodiments having fewer steps, more steps, or different steps are contemplated. Also, some embodiments may perform some or all of the steps in FIG. 3 in a different order.

Figure 4A:
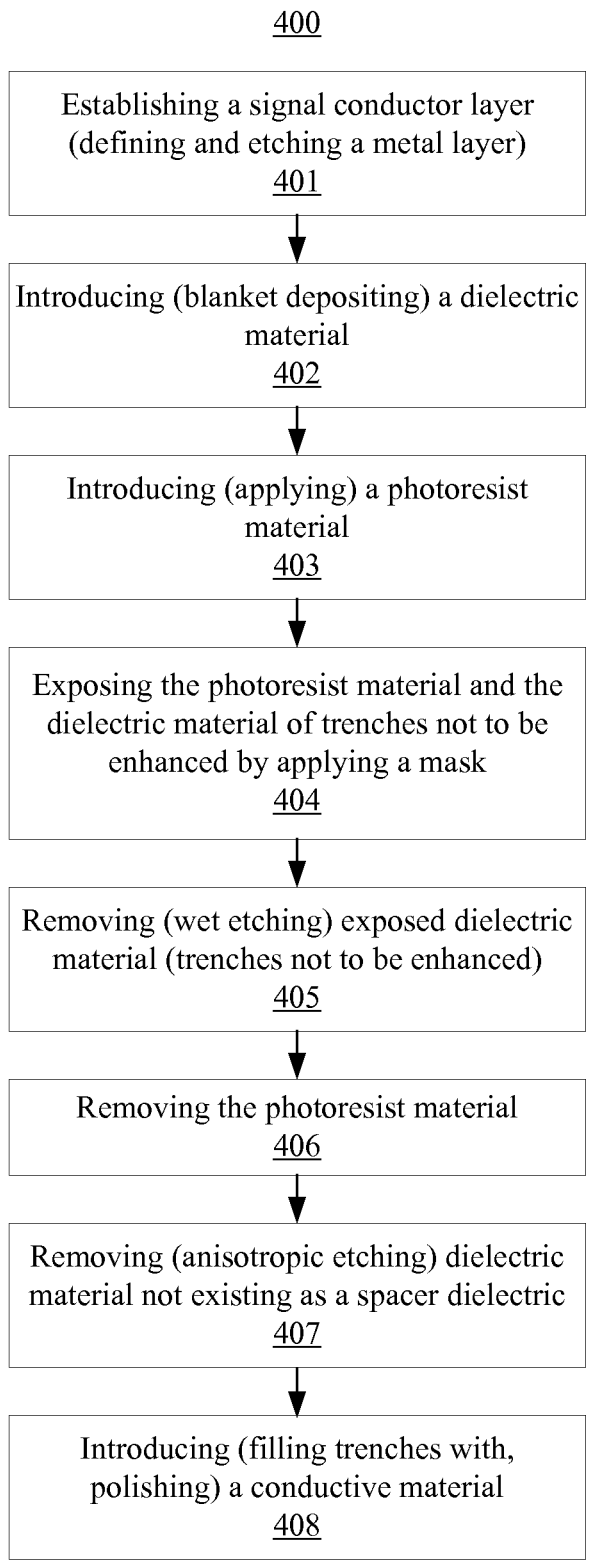
FIG. 4A is a flow chart showing an operation to manufacture a semiconductor device according to an embodiment.

FIG. 4A is a flow chart showing an operation 400 to manufacture a semiconductor device according to an embodiment. At block 401, operation 400 may include establishing a signal conductor layer (e.g., defining and etching a metal layer). See FIG. 4B. At block 402, operation 400 may include introducing (e.g., blanket depositing) a dielectric material. See FIG. 4C. At block 403, operation 400 may include introducing (e.g., applying) a photoresist material. See FIG. 4D. At block 404, operation 400 may include exposing the photoresist material and the dielectric material of trenches not to be enhanced by applying a mask. See FIG. 4E. At block 405, operation 400 may include removing (e.g., wet etching) exposed dielectric material (e.g., trenches not to be enhanced). See FIG. 4F. At block 406, operation 400 may include removing the photoresist material. See FIG. 4G. At block 407, operation 400 may include removing (e.g., anisotropic etching) dielectric material not existing as a spacer dielectric. See FIG. 4H. At block 408, operation 400 may include introducing (e.g., filling trenches with, polishing) a conductive material. See FIG. 4I. In addition to the described, other embodiments having fewer steps, more steps, or different steps are contemplated. Also, some embodiments may perform some or all of the steps in FIG. 4A in a different order.

Figure 4B:
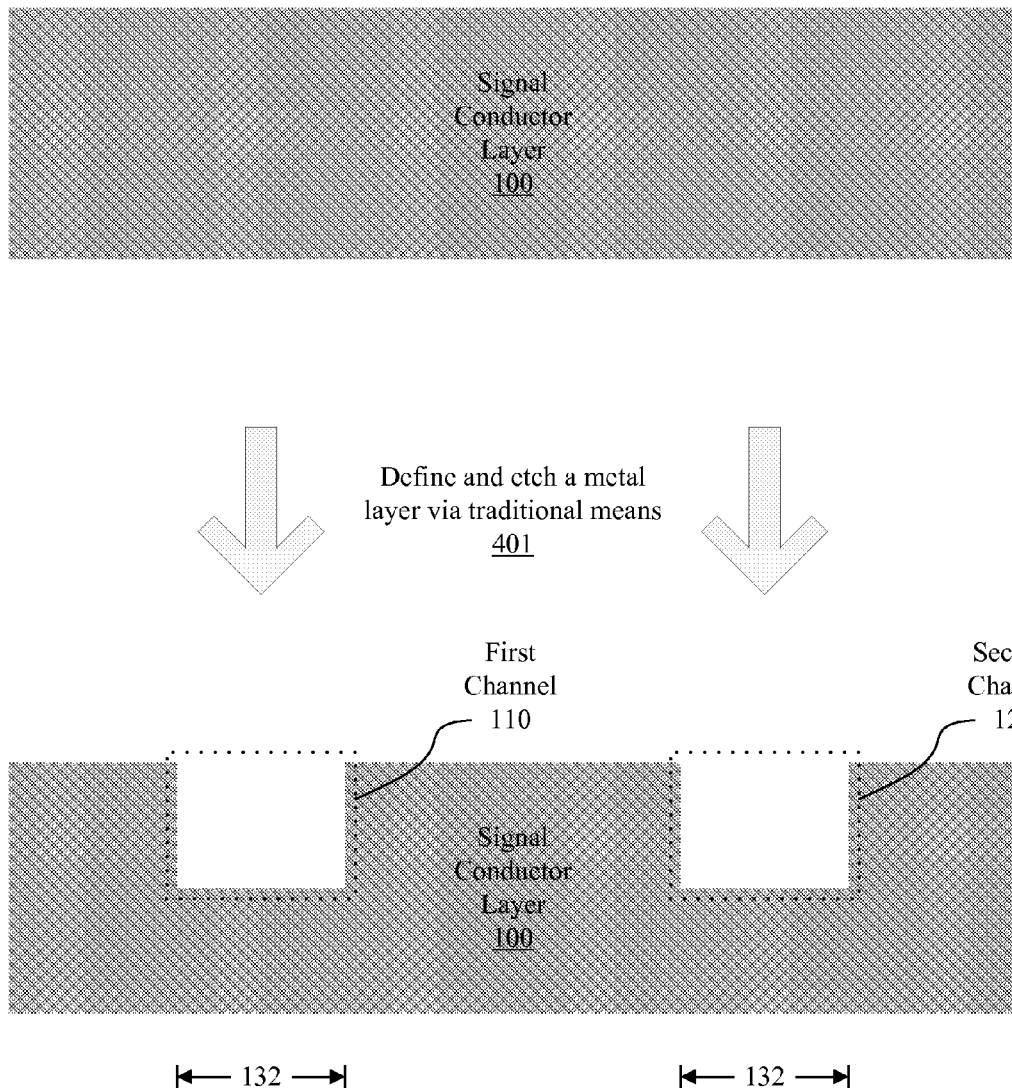
FIG. 4B illustrates an etching channels in the signal conductor layer according to an embodiment.

FIGS. 4B, 4C, 4D, 4E, 4F, 4G, 4H, 4I each illustrate a cross-sectional view of a semiconductor device according to an embodiment. FIGS. 4B, 4C, 4D, 4E, 4F, 4G, 4H, 4I each illustrate a "before and after" view of operation 400 at each block of FIG. 4A according to an embodiment. FIG. 4B illustrates an etching of the first channel 110 and the second channel 120 in the signal conductor layer 100 according to an embodiment. The first channel 110 and the second channel 120 may each have the cross-sectional height 131 and the cross-sectional width 132.

Figure 4C:
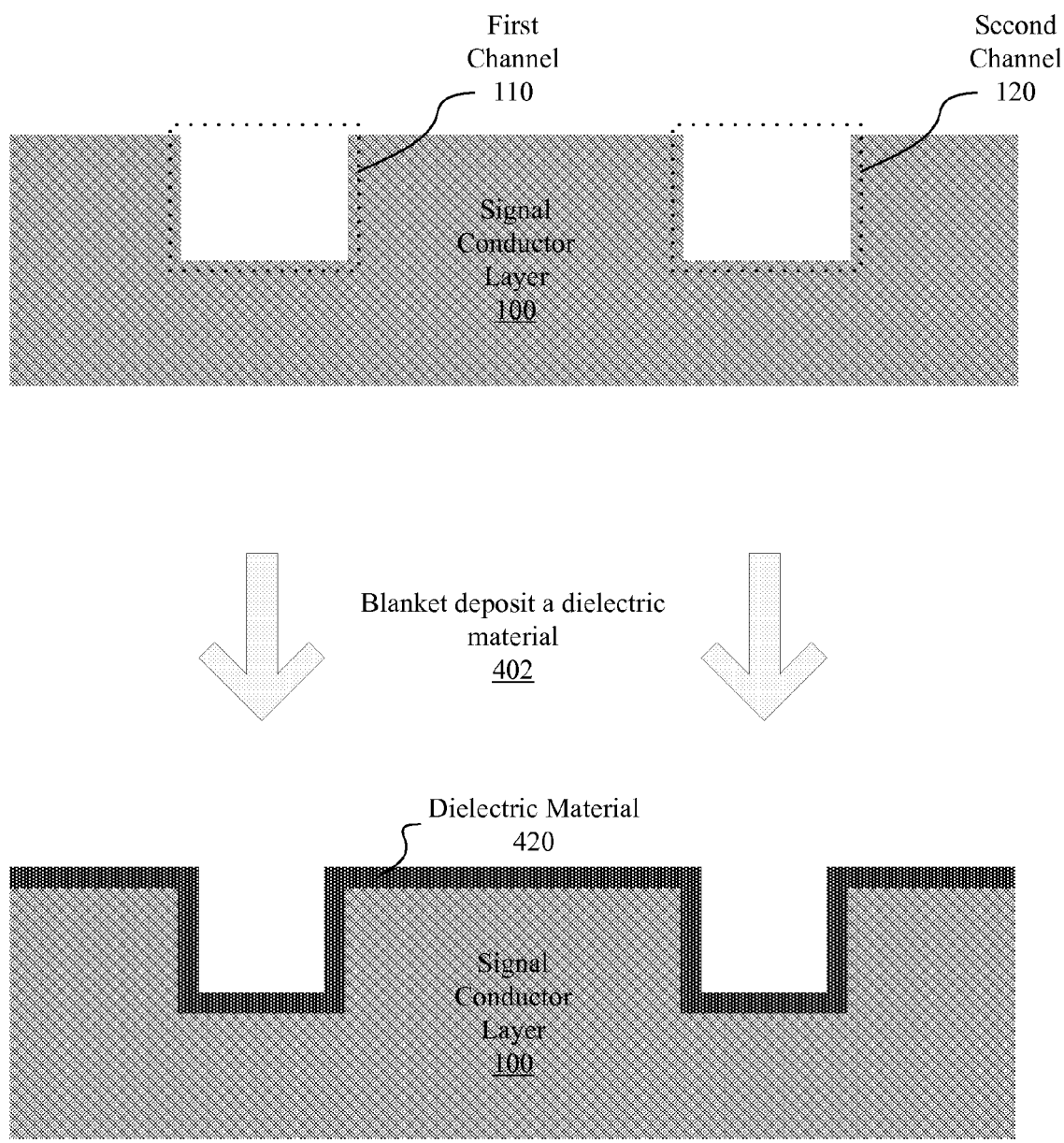
FIG. 4C illustrates a depositing of a dielectric material to the semiconductor device according to an embodiment.
Figure 4E:
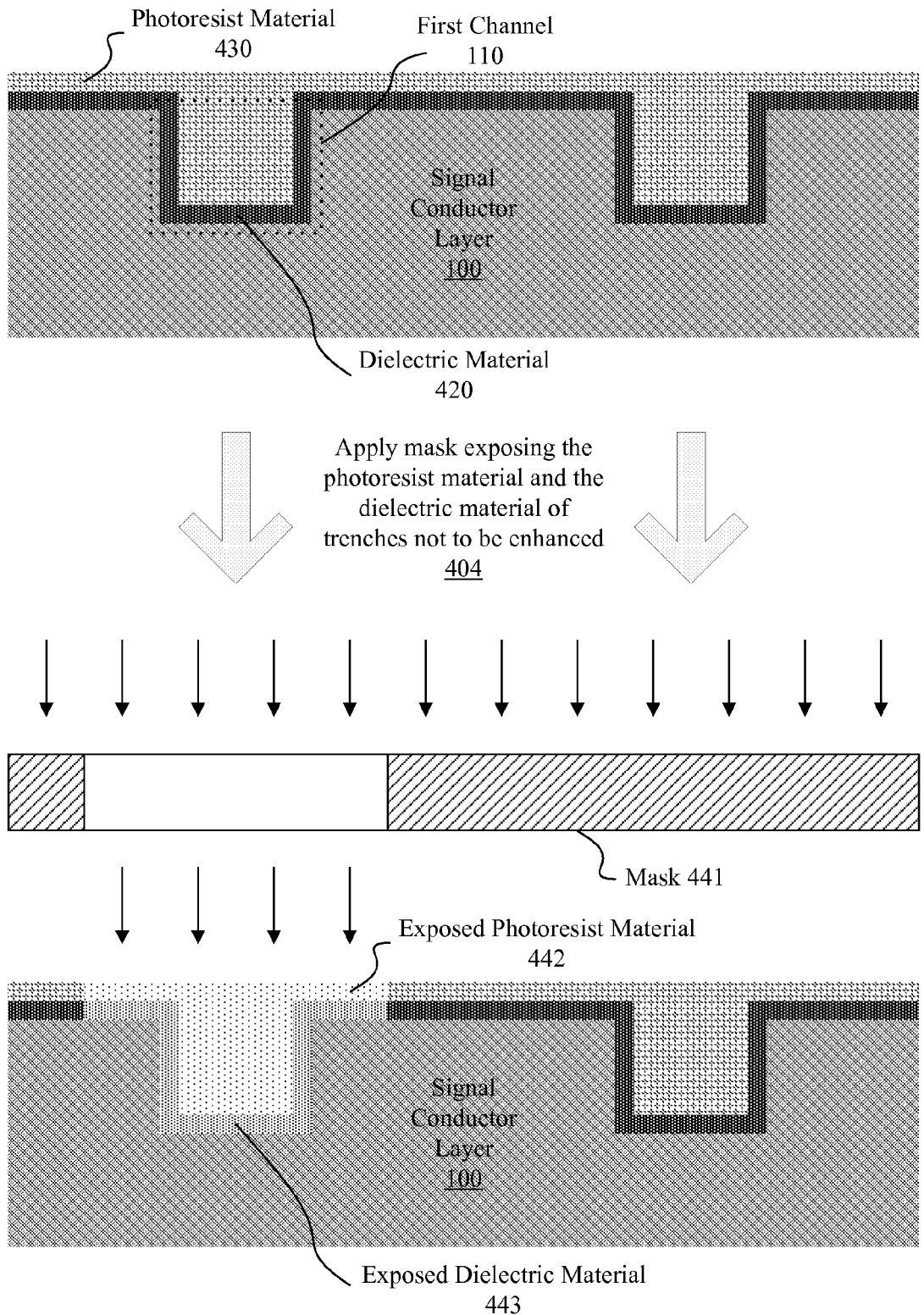
FIG. 4E illustrates an exposing of the photoresist material and the dielectric material according to an embodiment.

FIG. 4C illustrates a depositing of a dielectric material 420 to the semiconductor device according to an embodiment. In embodiments, the dielectric material 420 may not be an equivalent dielectric material to that of the signal conductor layer 100. FIG. 4D illustrates an applying of a photoresist material 430 to the semiconductor device according to an embodiment. FIG. 4E illustrates an exposing of the photoresist material 430 and the dielectric material 420 of the first channel 110 which is a trench not to be enhanced. Mask 441 may be applied during a photolithographic process. After the photolithographic process, exposed photoresist material 442 and exposed dielectric material 443 may remain.

Figure 4F:
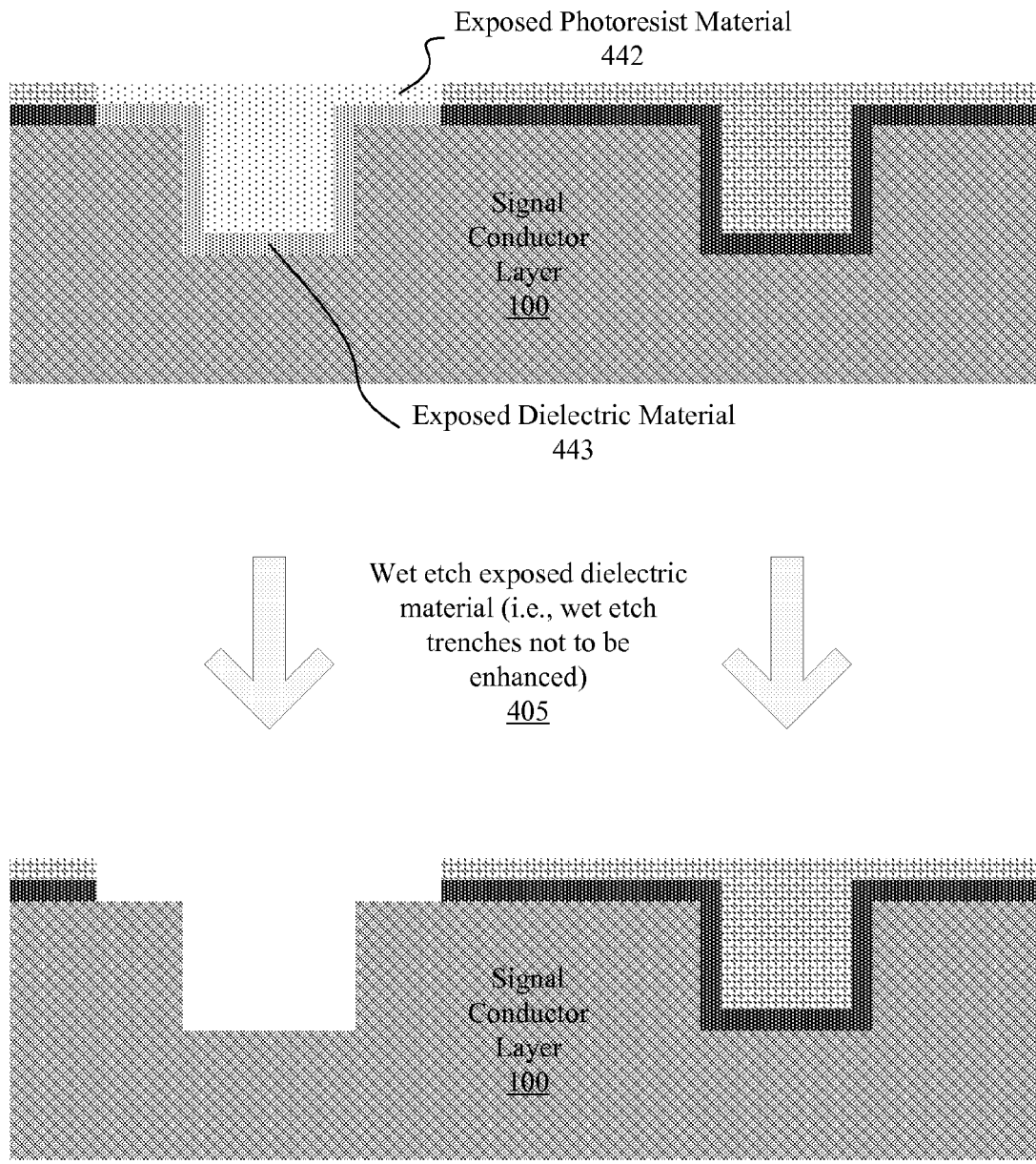
FIG. 4F illustrates a wet etch of the exposed dielectric material according to an embodiment.
Figure 4G:
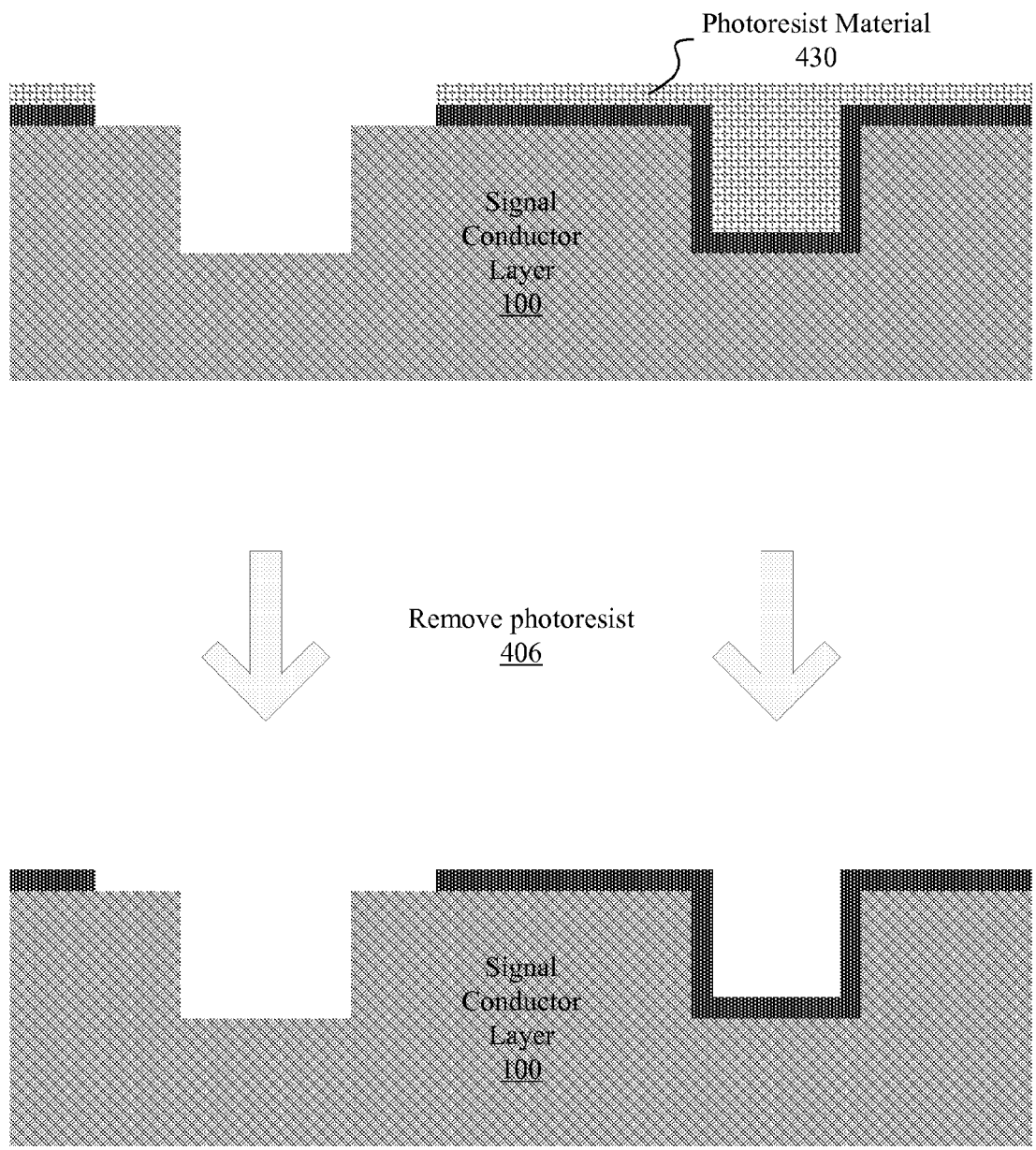
FIG. 4G illustrates a removal of the photoresist material according to an embodiment.

FIG. 4F illustrates a wet etch of the exposed dielectric material 443. The exposed photoresist material 442 may also be removed. FIG. 4G illustrates a removal of the photoresist material 430. FIG. 4H illustrates an anisotropic etch of the dielectric material 420 except for that which may exist as the spacer dielectric 121 on a side of a trench. The cross-sectional width 133 may be a horizontal width in the trench between the spacer dielectric 121 on the sides of the trench in an embodiment. FIG. 4I illustrates a conductor 101 (i.e., 101A in the first channel 110, 101B in the second channel 120) filling the trenches. The conductor 101 may extend the cross-sectional height 131 and the cross-sectional widths 132, 133. The finished product may be the same as FIG. 1.

Figure 5A:
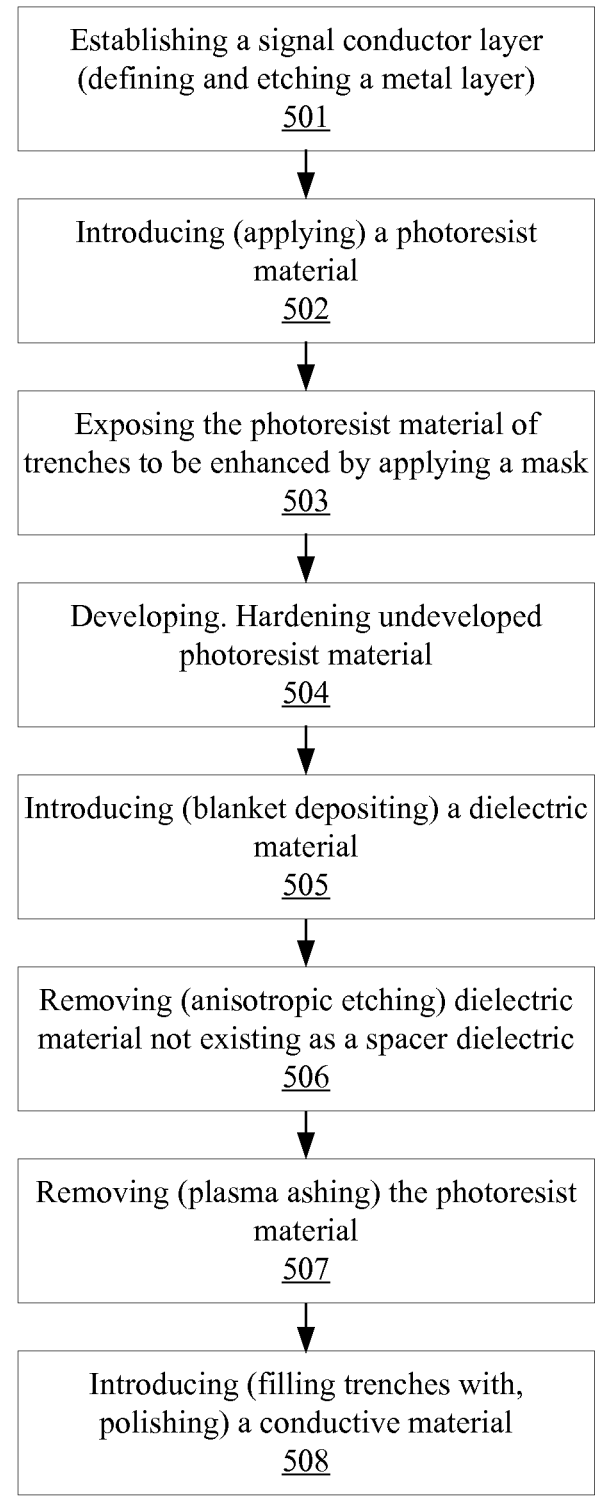
FIG. 5A is a flow chart showing an operation to manufacture a semiconductor device according to an embodiment.

FIG. 5A is a flow chart showing an operation 500 to manufacture a semiconductor device according to an embodiment. At block 501, operation 500 may include establishing a signal conductor layer (e.g., defining and etching a metal layer). See FIG. 5B. At block 502, operation 500 may include introducing (e.g., applying) a photoresist material. See FIG. 5C. At block 503, operation 500 may include exposing the photoresist material of trenches to be enhanced by applying a mask. See FIG. 5D. At block 504, operation 500 may include developing and may include hardening undeveloped photoresist material. See FIG. 5E. At block 505, operation 500 may include introducing (e.g., blanket depositing) a dielectric material. See FIG. 5F. At block 506, operation 500 may include removing (e.g., anisotropically etching) dielectric material not existing as a spacer dielectric. See FIG. 5G. At block 507, operation 500 may include removing (e.g., plasma ashing) the photoresist material. See FIG. 5H. At block 508, operation 500 may include introducing (e.g., filling trenches with, polishing) a conductive material. See FIG. 5I. In addition to the described, other embodiments having fewer steps, more steps, or different steps are contemplated. Also, some embodiments may perform some or all of the steps in FIG. 5A in a different order.

Figure 5B:
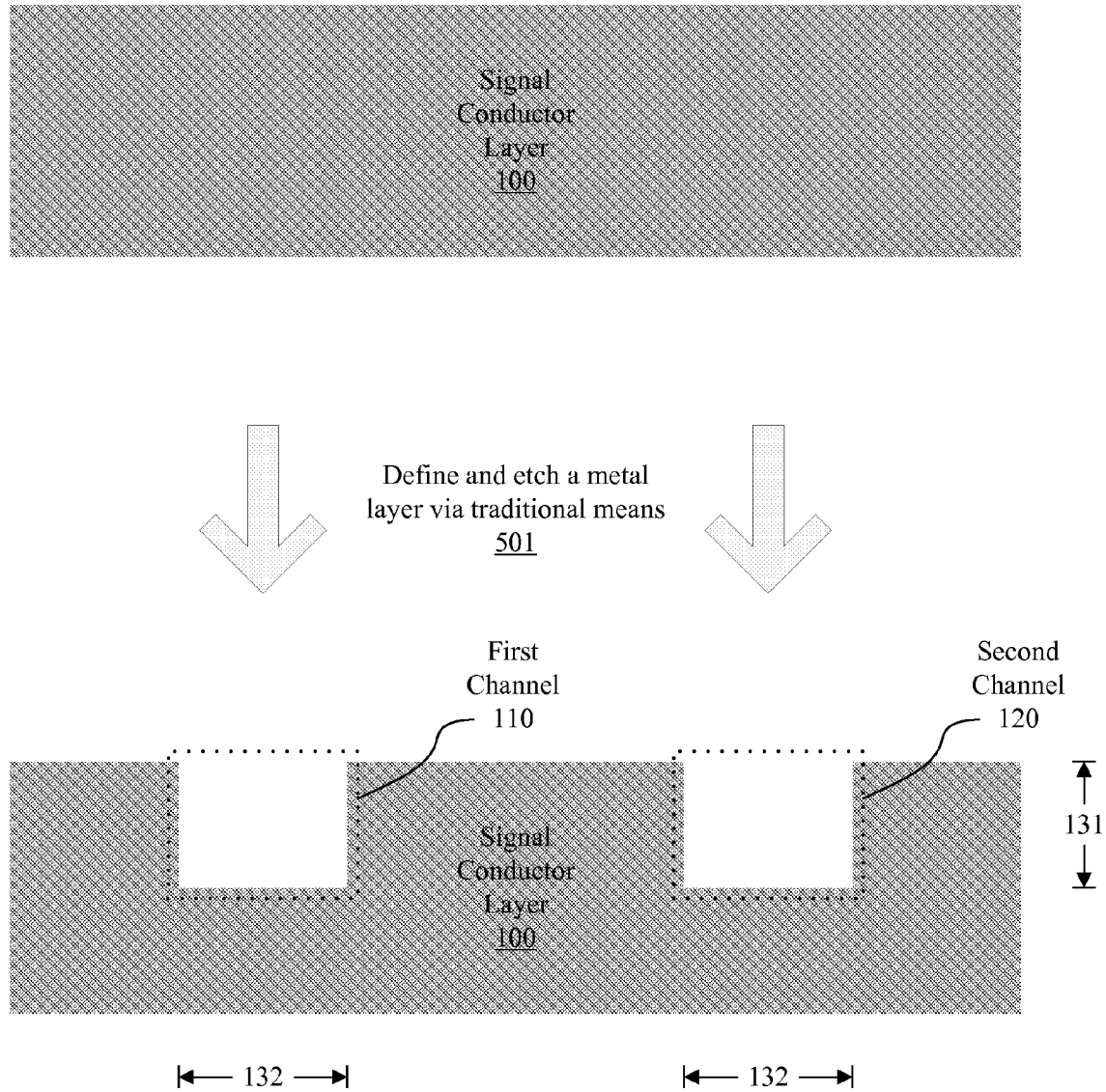
FIG. 5B illustrates an etching of channels in the signal conductor layer according to an embodiment.

FIGS. 5B, 5C, 5D, 5E, 5F, 5G, 5H, 5I each illustrate a cross-sectional view of a semiconductor device according to an embodiment. FIGS. 5B, 5C, 5D, 5E, 5F, 5G, 5H, 5I each illustrate a "before and after" view of operation 500 at each block of FIG. 5A according to an embodiment. FIG. 5B illustrates an etching of the first channel 110 and the second channel 120 in the signal conductor layer 100 according to an embodiment. The first channel 110 and the second channel 120 may each have the cross-sectional height 131 and the cross-sectional width 132.

Figure 5E:
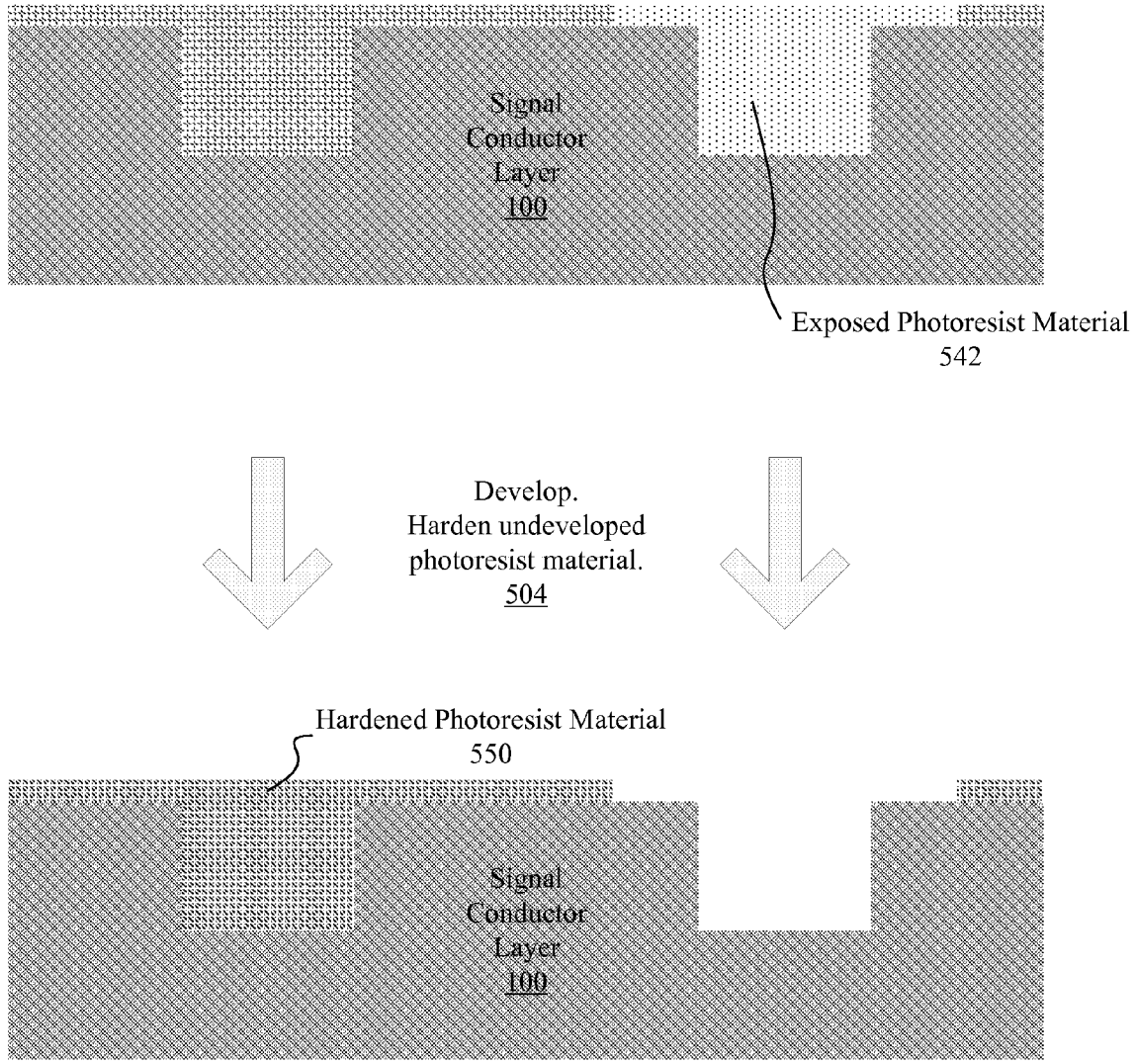
FIG. 5E illustrates a developing and a hardening of undeveloped photoresist material according to an embodiment.

FIG. 5C illustrates an applying of a photoresist material 520 to the semiconductor device according to an embodiment. FIG. 5D illustrates an exposing of the photoresist material 520 of the second channel 120 which is a trench to be enhanced. Mask 541 may be applied during a photolithographic process. After the photolithographic process, exposed photoresist material 542 may remain. FIG. 5E illustrates a developing and a hardening of undeveloped photoresist material resulting in a hardened photoresist material 550.

Figure 5F:
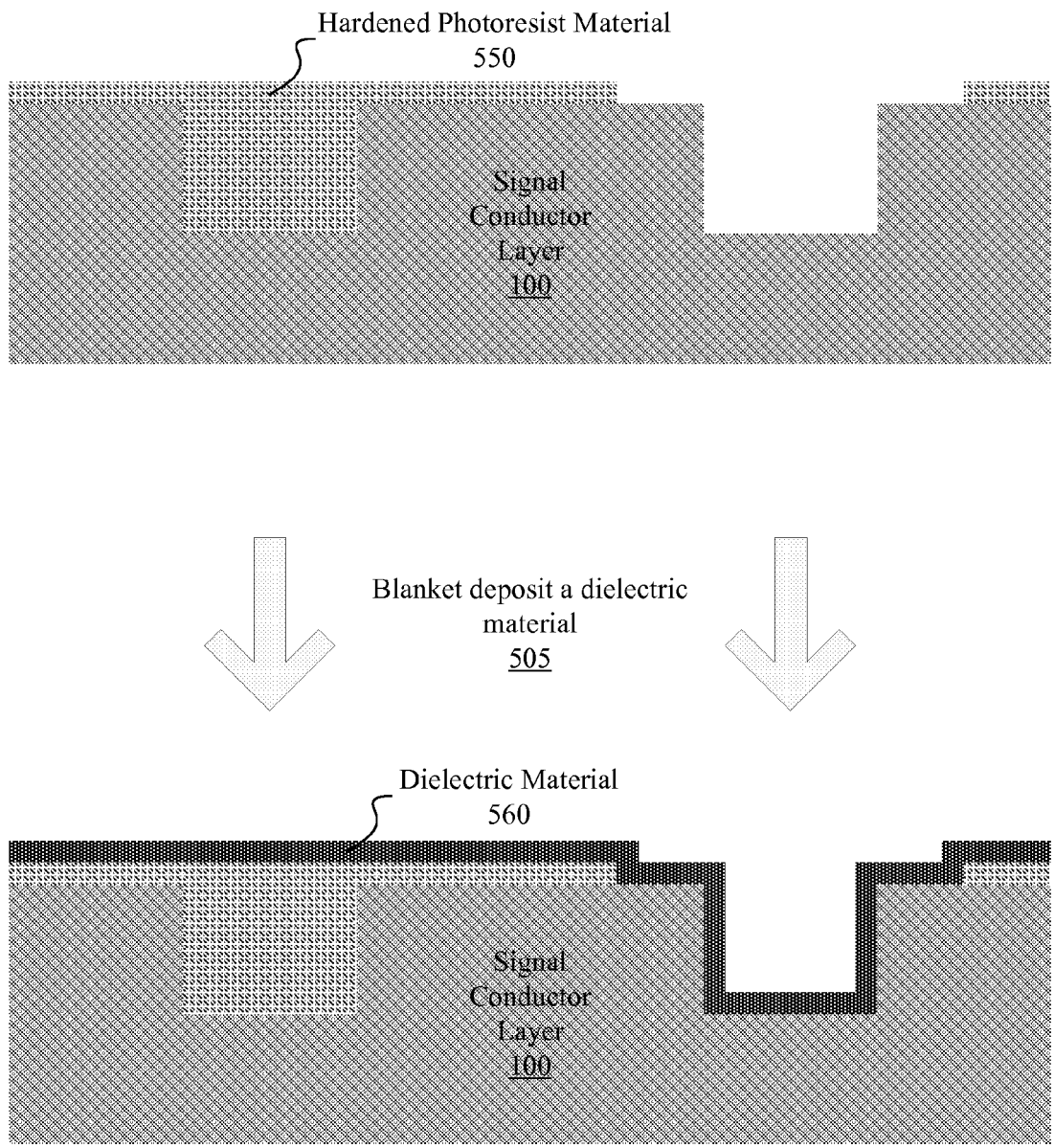
FIG. 5F illustrates a depositing of a dielectric material to the semiconductor device according to an embodiment.
Figure 5I:
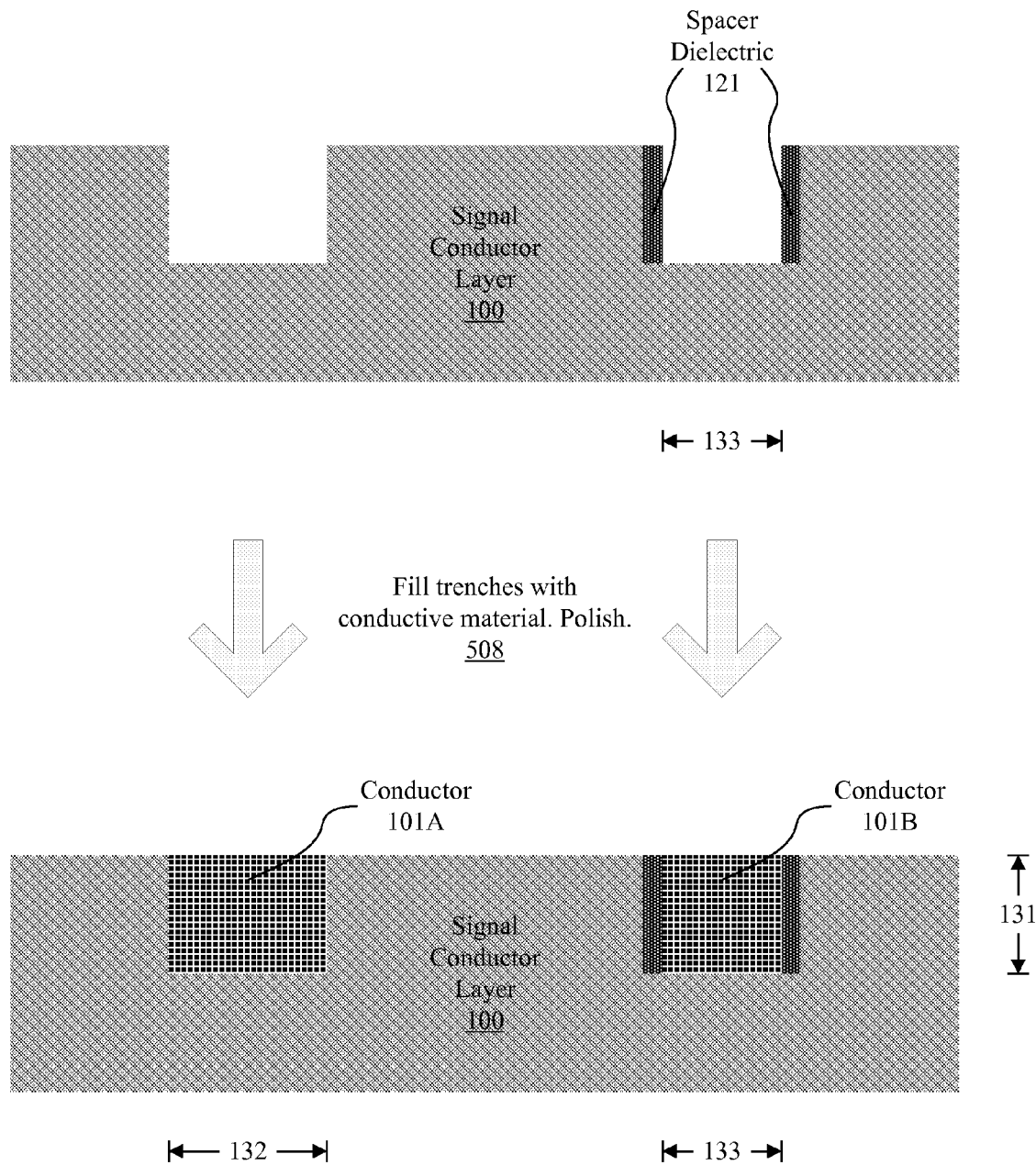
FIG. 5I illustrates a conductor filling the trenches according to an embodiment.

FIG. 5F illustrates a depositing of a dielectric material 560 to the semiconductor device according to an embodiment. FIG. 5G illustrates an anisotropic etch of the dielectric material 560 except for that which may exist as the spacer dielectric 121 on a side of a trench. The anisotropic etch may remove the dielectric material 560 on planar surfaces. The cross-sectional width 133 may be a horizontal width in the trench between the spacer dielectric 121 on the sides of the trench in an embodiment. FIG. 5H illustrates a removal of the hardened photoresist material 550 which may be completed via plasma ashing. FIG. 5I illustrates a conductor 101 (i.e., 101A in the first channel 110, 101B in the second channel 120) filling the trenches. The conductor 101 may extend the cross-sectional height 131 and the cross-sectional widths 132, 133. The finished product may be the same as FIG. 1.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

What is claimed is:

1. A semiconductor device, comprising:
    a signal conductor layer formed of an insulating material and channels, the signal conductor layer having:
        a first channel and a second channel, the first channel and the second channel having a substantially equivalent cross-sectional area, and
        the insulating material bordering at least three edges of the first channel and bordering at least three edges of the second channel;
    a first conductor in the first channel having a first cross-sectional area, wherein the first conductor touches the insulating material;
    a second conductor in the second channel having a second cross-sectional area, the second cross-sectional area smaller than the first cross-sectional area, wherein the second conductor touches the insulating material; and
    a spacer dielectric on a side of the second channel.

2. The semiconductor device of claim 1, wherein the spacer dielectric has a permittivity less than 3.0.

3. The semiconductor device of claim 1, wherein the side is a vertical side.

4. The semiconductor device of claim 3, wherein the second cross-sectional area is at least eighty percent of the first cross-sectional area.

5. The semiconductor device of claim 1, wherein the first channel is a power channel and the second channel is a signal channel.

6. The semiconductor device of claim 1, wherein at least a portion of at least one side of the second channel does not include the spacer dielectric.

7. The semiconductor device of claim 1, wherein portions of at least two sides of the second channel do not include the spacer dielectric.

8. The semiconductor device of claim 1, wherein the first and second conductors are metal.

9. The semiconductor device of claim 1, wherein the first channel has a first wire and the second channel has a second wire.

10. The semiconductor device of claim 9, wherein at least a portion of a bottom side of the second channel is in contact with the second wire.

11. The semiconductor device of claim 1, wherein the spacer dielectric includes fluorine-doped silicon dioxide.

12. The semiconductor device of claim 1, wherein the spacer dielectric includes carbon-doped silicon dioxide.

13. The semiconductor device of claim 1, wherein the insulating material is an oxide.

14. The semiconductor device of claim 1, wherein the insulating material beneath both the first channel and the second channel includes neither the first channel nor the second channel being extended fully through the insulating material.

15. The semiconductor device of claim 1, wherein a cross-sectional height of the second channel does not exceed a cross-sectional height of the insulating material.

16. The semiconductor device of claim 1, wherein the first conductor is bordered on at least three edges by the insulating material and the second conductor is bordered on at least one edge by the insulating material.

17. The semiconductor device of claim 16, wherein the second conductor is bordered on at least one edge by the spacer dielectric.

18. A semiconductor device, comprising:
a signal conductor layer formed of an insulating material and channels, the signal conductor layer having:
a first channel and a second channel, the first channel and the second channel having a substantially equivalent cross-sectional area, and
the insulating material bordering at least three edges of the first channel and bordering at least three edges of the second channel;
a first conductor in the first channel having a first cross-sectional area;
a second conductor in the second channel having a second cross-sectional area, the second cross-sectional area smaller than the first cross-sectional area; and
a spacer dielectric on a side of the second channel, wherein portions of at least two sides of the second channel do not include the spacer dielectric.

19. The semiconductor device of claim 18, wherein the second cross-sectional area is at least eighty percent of the first cross-sectional area, and wherein the first channel has a first wire and the second channel has a second wire.

20. The semiconductor device of claim 18, wherein the insulating material beneath both the first channel and the second channel includes neither the first channel nor the second channel being extended fully through the insulating material, and wherein a cross-sectional height of the second channel does not exceed a cross-sectional height of the insulating material.

* * * * *